US007811722B2

(12) United States Patent
Moon

(10) Patent No.: US 7,811,722 B2
(45) Date of Patent: Oct. 12, 2010

(54) PHOTOMASK AND METHOD FOR FABRICATING THE SAME

(75) Inventor: Jae In Moon, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 398 days.

(21) Appl. No.: 11/646,924

(22) Filed: Dec. 27, 2006

(65) Prior Publication Data

US 2008/0003508 A1 Jan. 3, 2008

(30) Foreign Application Priority Data

Jun. 28, 2006 (KR) ...................... 10-2006-0058935

(51) Int. Cl.
*G03F 1/00* (2006.01)
(52) U.S. Cl. ............................ 430/5; 716/19
(58) Field of Classification Search .................... 430/5, 430/30, 311; 716/19, 21
See application file for complete search history.

(56) References Cited

U.S. PATENT DOCUMENTS 6,841,315 B2 * 1/2005 Imura ............................ 430/5

| 2001/0049064 A1 * | 12/2001 | Lee et al. ........................ 430/5 |
| 2003/0082463 A1 * | 5/2003 | Laidig et al. ..................... 430/5 |
| 2004/0115539 A1 * | 6/2004 | Broeke et al. ................... 430/5 |
| 2006/0216616 A1 | 9/2006 | Shin et al. ....................... 430/5 |
| 2006/0257753 A1 | 11/2006 | Kim et al. ....................... 430/5 |
| 2007/0105023 A1 * | 5/2007 | Zhou et al. ...................... 430/5 |

FOREIGN PATENT DOCUMENTS

| KR | 10-2002-0053753 | 7/2002 |
| KR | 10-2005-0069505 | 7/2005 |
| KR | 10-2005-0069506 | 7/2005 |

* cited by examiner

*Primary Examiner*—Mark F Huff
*Assistant Examiner*—Stewart A Fraser
(74) *Attorney, Agent, or Firm*—Marshall, Gerstein & Borun LLP

(57) ABSTRACT

A photomask comprises a transparent substrate, a peripheral pattern formed on the transparent substrate along a contour of a target pattern to be transferred onto a wafer, and an assist pattern disposed inside the peripheral pattern. The photomask has the assist pattern formed inside the target pattern, thereby preventing the assist pattern from being undesirably on the target pattern. In addition, the method can fabricate the assist pattern in a complicated structure which cannot be realized by the conventional technique, so that it can be applied to any kinds of patterns.

7 Claims, 6 Drawing Sheets

PHOTOMASK AND METHOD FOR FABRICATING THE SAME

CROSS-REFERENCE TO RELATED APPLICATION

The present application claims priority to Korean application number 10-2006-0058935, filed on Jun. 28, 2006, which is incorporated by reference in its entirety.

BACKGROUND OF THE INVENTION

The present invention relates to a photomask and, more particularly, to a photomask, which can enhance resolution of an exposure process through an improvement in depth of focus and exposure latitude margins, and a method for fabricating the same.

Generally, a semiconductor memory such as dynamic random access memory (DRAM) comprises a number of micro patterns. The micro patterns are formed through photolithography. Photolithography is generally carried out by coating a photoresist layer on a target layer of a semiconductor wafer, exposing, and developing the photoresist layer. Then, some portions of the photoresist layer are selectively removed to form photoresist layer patterns which expose some portions of the target layer. Then, the exposed portions of the target layer are removed by an etching process using the patterned photoresist layer as a mask, followed by stripping off the patterned photoresist layer from the target layer, thereby forming desired patterns on the semiconductor wafer.

However, as a pattern is further reduced via an enhanced technique, for example, to provide highly integrated semiconductor devices, manufacturers of the semiconductor devices encounter new problems in semiconductor manufacturing processes, such as an exposure process, which have not occurred in the past. In particular, reduction in size of the patterns causes problems, such as reduction in depth of focus (DOF) margin and exposure latitude (EL) margin, on the photoresist which serves to transfer the patterns to the wafer. In this regard, optical proximity correction (OPC) is performed to overcome such a problem of reduction in DOF margin and EL margin, or an assist pattern is employed to compensate for reduction in the margin of the target pattern.

A conventional method of compensating the margin of the target pattern disposed on the photomask by use of an assist pattern is described with reference to FIG. 1. Referring to FIG. 1, a conventional photomask 100 has a target pattern 120 formed on a transparent substrate 110, and an assist pattern 130 formed next to the target pattern 120. When performing an exposure process using the photomask 100, the assist pattern 130 can be transferred to the target layer, causing an undesirable pattern to be formed on a wafer. In addition, if the conventional photomask is not provided with a space in which the assist pattern 130 can be formed around the target pattern 120, the exposure process is inevitably performed without using the assist pattern 130. In other words, if some conditions for adopting the assist pattern 130 are not satisfied, the assist pattern 130 cannot be applied to every kind of micro pattern.

Thus, there are needs of a photomask and a method for fabricating the same, which can prevent the assist pattern from being formed on the wafer due to transfer of the assist pattern to the target layer, and which can enhance a process margin, for example, the DOF margin and the EL margin, in any kind of target pattern.

SUMMARY OF THE INVENTION

One embodiment of the present invention relates to providing a photomask, which can enhance resolution of an exposure process through an improvement in depth of focus and EL margins. Another embodiment provides a method for fabricating such a photomask.

In accordance with one aspect of the present invention, the above and other embodiments can be accomplished by providing a photomask comprising a transparent substrate; a peripheral pattern formed on the transparent substrate along a contour of a target pattern to be transferred onto a wafer; and an assist pattern located inside the peripheral pattern.

The assist pattern may comprise a plurality of line patterns spaced from one another so as to induce a bridge between adjacent line patterns via optical interference when the assist pattern is transferred onto the wafer, and each of the line patterns may comprise a light shielding region.

The assist pattern may comprise a plurality of dot patterns spaced from one another to induce a bridge between adjacent dot patterns via optical interference when the assist patterns are transferred onto the wafer, and the assist pattern may comprise a light transmitting region to induce the bridge between adjacent sections of the peripheral pattern via the optical interference when the assist pattern is transferred onto the wafer.

The peripheral pattern may comprise dot patterns spaced from one another to induce a bridge between the dot patterns when the peripheral pattern is transferred onto the wafer, and the peripheral pattern may comprise a light shielding region.

In accordance with another aspect of the present invention, a method for fabricating a photomask comprises setting a layout of a target pattern to be transferred onto a wafer; extracting a peripheral pattern formed along a layout contour of the target pattern; disposing an assist pattern inside the peripheral pattern; and forming layouts of the peripheral pattern and the assist pattern on a mask substrate.

The extracting of the peripheral pattern may comprise setting a small scale layout reduced by a predetermined width inward from the layout contour of the target pattern; setting the peripheral pattern to have the layout contour of the target pattern; and setting a contour of the small scale layout to have a layout contour of the peripheral pattern.

The assist pattern may comprise a plurality of line patterns spaced from one another to induce a bridge between adjacent line patterns via optical interference when the assist pattern is transferred onto the wafer, and each of the line patterns may comprise a light shielding region.

The assist pattern may comprise a plurality of dot patterns spaced from one another to induce a bridge between adjacent dot patterns via optical interference when the assist patterns are transferred onto the wafer.

The assist pattern may comprise a light transmitting region to induce a bridge between adjacent sections of the peripheral pattern via optical interference when the assist pattern is transferred onto the wafer.

The peripheral pattern may comprise dot patterns spaced from one another to induce a bridge between the dot patterns when the peripheral pattern is transferred onto the wafer, and the peripheral pattern may comprise a light shielding region.

BRIEF DESCRIPTION OF THE DRAWINGS

The above and other embodiments, features and other advantage of the present invention will be more clearly understand from the following detailed description taken in conjunction with the accompanying drawings, in which.

DESCRIPTION OF THE SPECIFIC EMBODIMENTS

Figure 1:
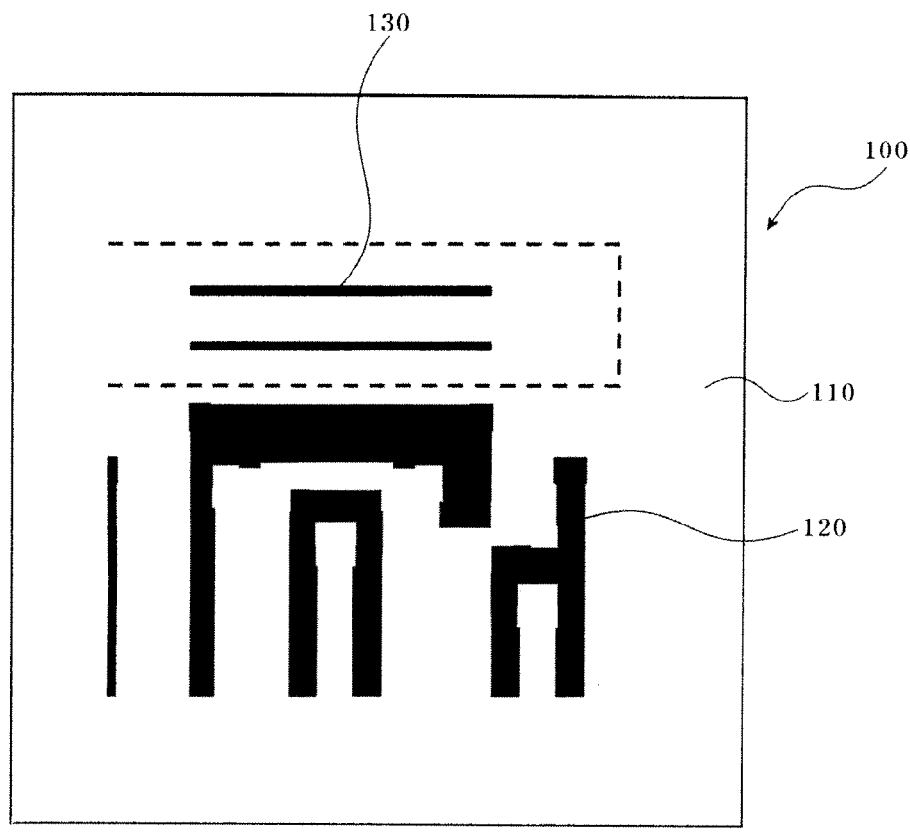
FIG. 1 is a plan view showing an assist pattern disposed on a conventional photomask.

Embodiments of the present invention will be described in detail with reference to the accompanying drawings, wherein like reference numerals refer to like elements throughout the drawings. It should be understood that the embodiments and the accompanying drawings are provided for illustrative purposes, and do not limit the scope of the present claims. Additionally, it should be further understood that the layers and regions shown in the drawings are shown for descriptive purposes (and are not illustrated to scale).

Figure 2:
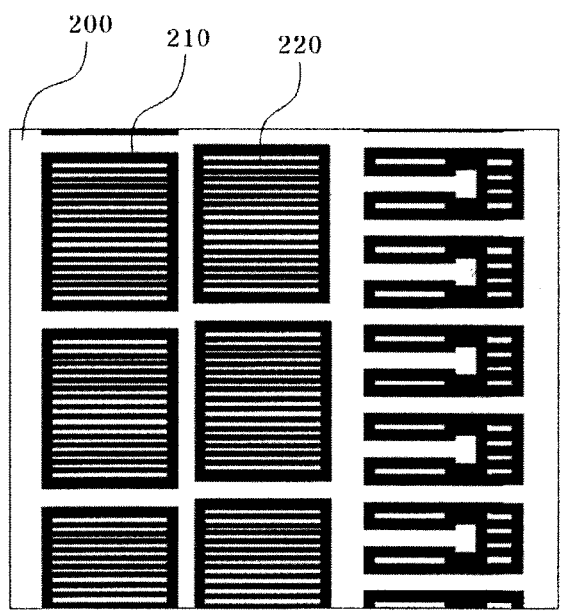
FIG. 2 is a plan view showing a photomask according to the present invention.

Referring to FIG. 2, a photomask of the present invention comprises a transparent substrate 200, peripheral patterns 210 formed on the transparent substrate 200 along a contour of a target pattern to be transferred onto a wafer, and an assist pattern 220 disposed inside each peripheral pattern 210. The transparent substrate 200 is formed from a transparent insulating material such as glass or quartz.

The assist pattern 220 comprises a plurality of patterns spaced from one another to induce a bridge between adjacent patterns via optical interference when the assist pattern 220 is transferred onto the wafer. Specifically, the assist pattern 220 may comprise a plurality of line patterns or a plurality of dot patterns. If the assist pattern 220 comprises the plurality of line patterns, each line pattern generally comprises a light shielding region. In addition, the assist pattern 220 may comprise light transmitting regions spaced from each other to induce a bridge between adjacent sections of the peripheral pattern 210 via the optical interference when the assist pattern 220 is transferred onto the wafer.

Each of the peripheral patterns 210 formed along the contour of the target pattern may comprise dot patterns spaced from one another to induce a bridge therebetween via optical interference when the peripheral patterns 210 are transferred onto the wafer.

A photomask and a method for fabricating the same according to the present invention are described with reference to FIGS. 3 to 8.

Figure 3:
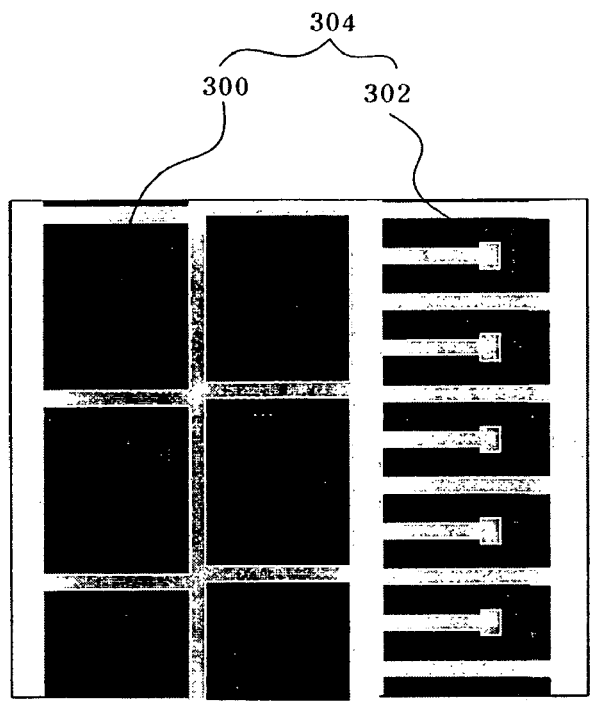
FIGS. 3 to 10 illustrate a method of fabricating a photomask according to the present invention.

Referring to FIG. 3, a layout of a target pattern 304 to be transferred onto a wafer is set onto the wafer. In this embodiment, the target pattern 304 comprises a first pattern 300 which has no space defined therein, and a second pattern 302 which has a space defined therein.

Figure 4:
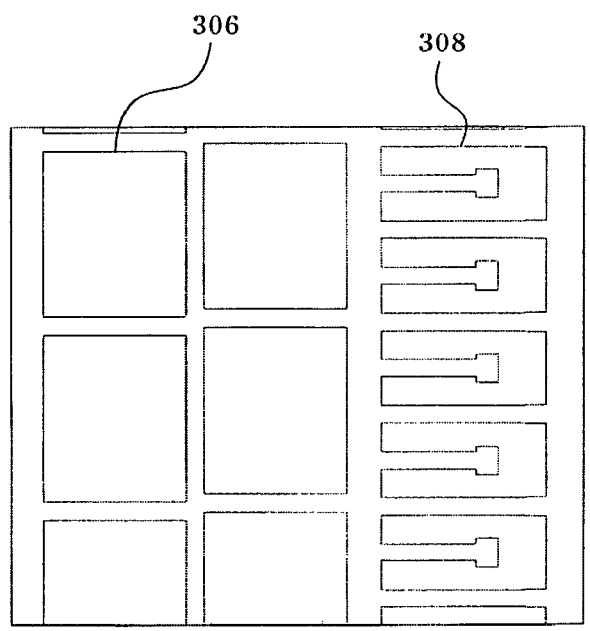

Referring to FIG. 4, peripheral sections, for example, first and second layouts 306 and 308, respectively, formed along layout contours of the first and second patterns 300 and 302 in the target pattern are extracted. Here, the first and second layouts 306 and 308 show the layout contours of the target pattern 304.

Figure 5:
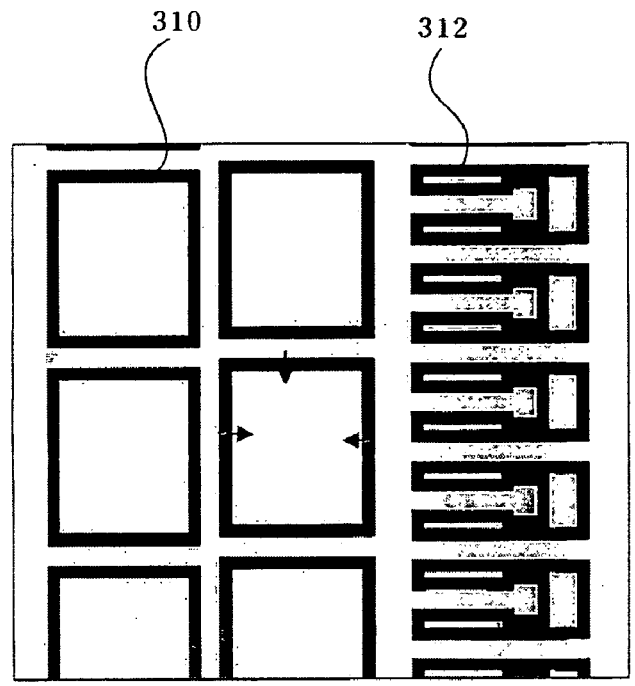

Referring to FIG. 5, small scale layouts are set by a biasing operation which forms the small scale layouts at a predetermined distance inward from the first and second layouts 306 and 308 shown along the layout contours of the target pattern. Then, first and second peripheral patterns 310 and 312 are formed, which have the layout contours of the target pattern and contours of the small scale layouts. Here, each of the first and second peripheral patterns 310 and 312 may comprise dot patterns to induce a bridge between the dot patterns via optical interference when the peripheral pattern is transferred onto a wafer. Here, each of the first and second peripheral patterns 310 and 312 preferably comprises a light shielding region.

Figure 6:
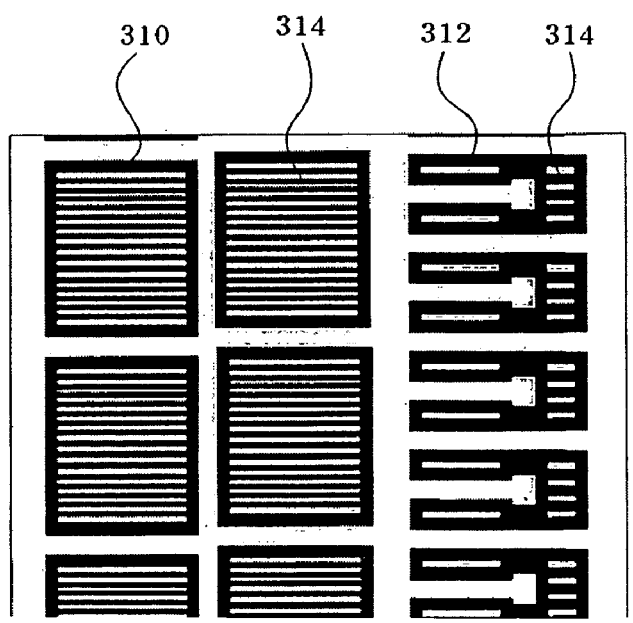

Referring to FIG. 6, an assist pattern 314 is disposed inside each of the first and second peripheral patterns 310 and 312.

The assist pattern 314 may comprise a plurality of line patterns spaced from one another to induce a bridge between adjacent line patterns via the optical interference when the assist pattern 314 is transferred onto the wafer. Each of the line patterns may comprise a light shielding region. The assist pattern 314 may comprise a plurality of dot patterns spaced from one another to induce a bridge between adjacent dot patterns via the optical interference when the assist pattern 314 is transferred onto the wafer. In addition, the assist pattern 314 may comprise a light transmitting region.

In the case where an illuminating system for an exposure process is a symmetric illuminating system, it may be formed by assembling square spaces.

Figure 7:
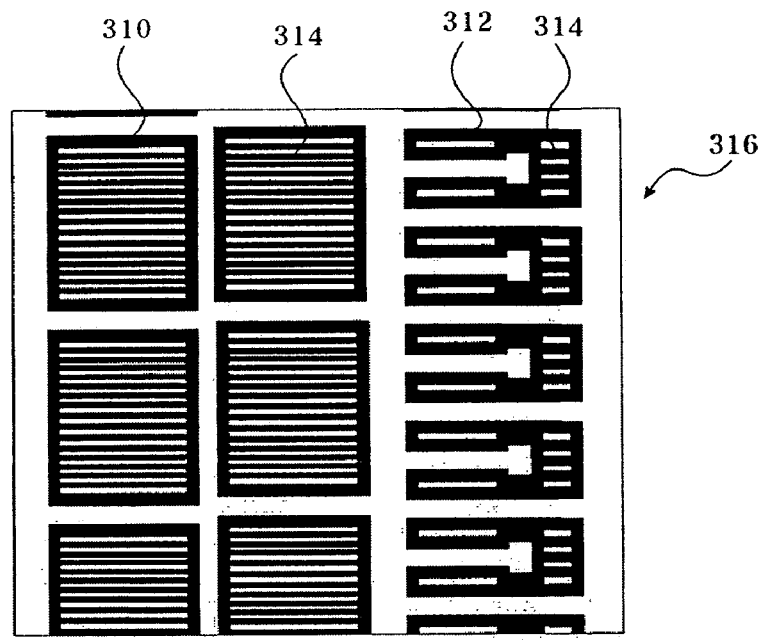
Figure 8:
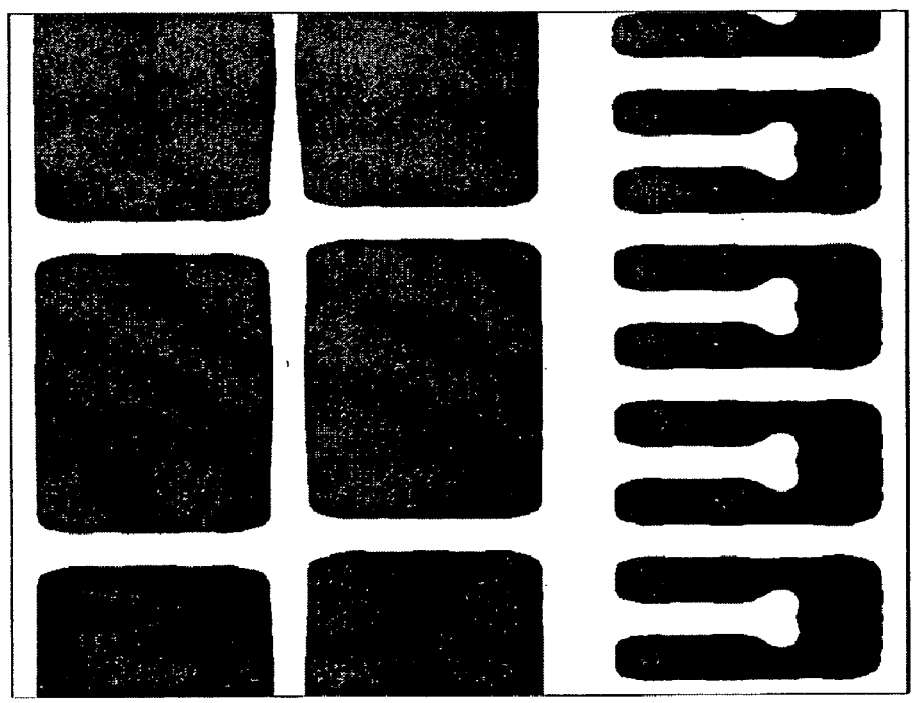

Referring to FIG. 7, layouts of the first and second peripheral patterns 310 and 312 and the assist patterns 314 are formed on a mask substrate, thereby forming a photomask 316.

With simulation using the photomask 316 which has the layouts of the first and second peripheral patterns 310 and 312 and the assist pattern 314 formed thereon, the assist pattern 314 is disposed inside each of the peripheral patterns 310, 312, and the bridge is induced between sections of the assist pattern 314, thereby filling the interior of each peripheral pattern 310, 312. In addition, since the assist pattern 314 is disposed inside each of the peripheral patterns 310, 312, it is possible to prevent the assist pattern 314 from being formed at an undesired location.

Furthermore, since the assist pattern 314 is disposed inside each of the peripheral patterns 310, 312, a process margin is improved compared with a conventional photoresist. There will be described hereinafter an improvement in process margin with reference to FIGS. 9a to 10.

Figure 9A:
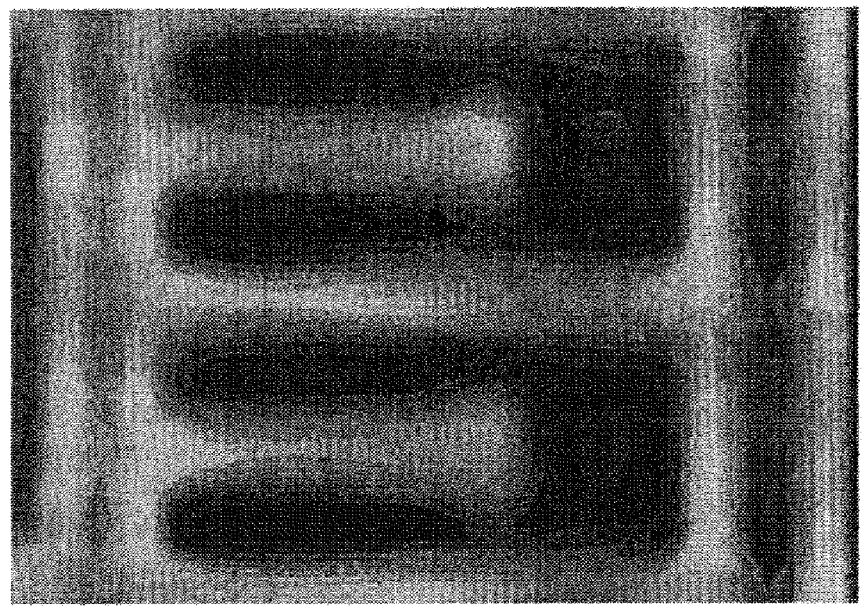
Figure 9B:
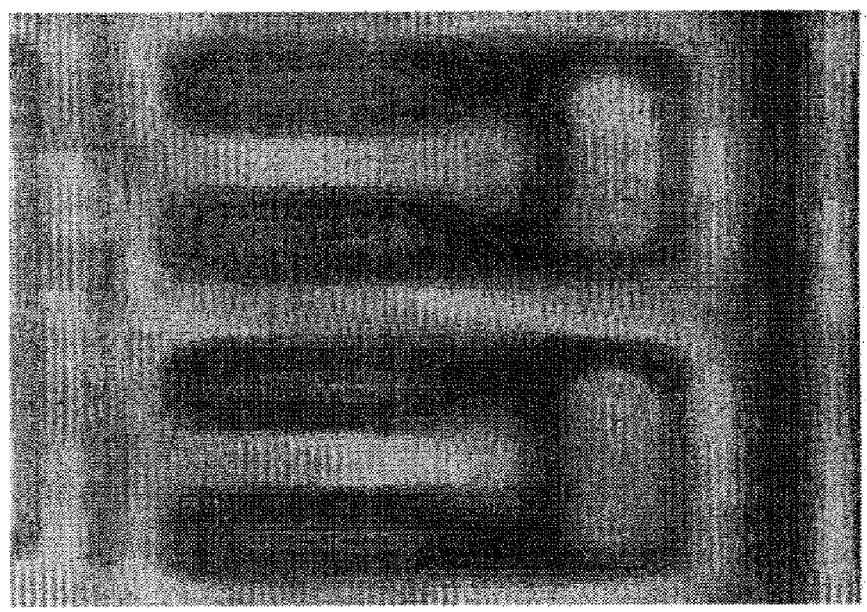

FIG. 9a shows an aerial image of a photomask which is subjected to optical proximity correction (OPC) according to a conventional technique. FIG. 9b shows an aerial image of a photomask formed using a target pattern which comprises peripheral patterns and assist patterns according to the present invention.

Referring to FIGS. 9a and 9b, it can be understood that, in comparison to the case where the OPC is applied to patterns according to the conventional technique, the photoresist having the target pattern according to the invention ensures more uniform distribution of light by virtue of a space 314 (see FIG. 7) in which the assist pattern is disposed, and a bridge between adjacent sections of each assist pattern.

Figure 10:
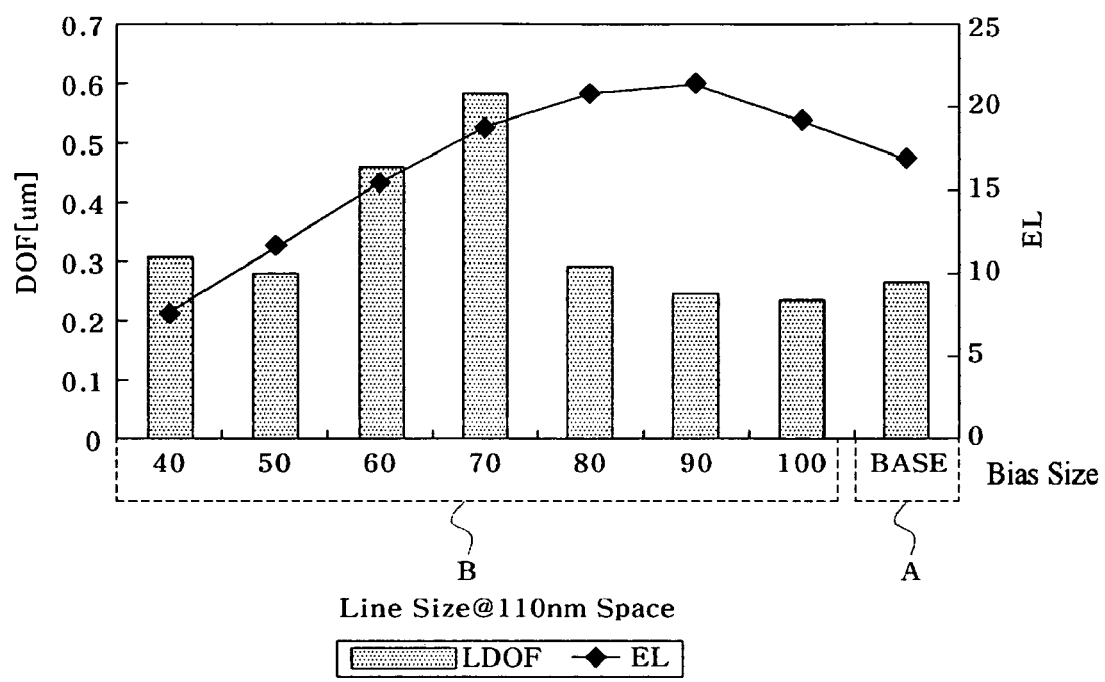

In FIG. 10, DOF and EL margins for the target pattern are shown. Referring to FIG. 10, in comparison to the case (A) where the OPC is applied to the pattern, the DOF margin is increased up to about 200%, and the EL margin is increased up to about 5% for the case where the peripheral patterns are formed through the biasing operation of the present invention. Here, when a biasing degree of extending each peripheral pattern inward of the target pattern is 70 nm, the photoresist exhibits the maximum DOF and EL margins.

As apparent from the above description, the photomask according to the present invention comprises an assist pattern formed inside a target pattern, thereby preventing the assist pattern from being undesirably formed on the target pattern. In addition, the method of the present invention can fabricate the assist pattern in a complicated structure which cannot be realized by the conventional technique, so that it can be applied to any kinds of patterns.

It should be understood that the embodiments and the accompanying drawings have been described for illustrative purposes and the present invention is limited only by the following claims. Further, those skilled in the art will appreciate that various modifications, additions and substitutions of the description provided herein are within the scope and spirit of the accompanying claims.

What is claimed is:

1. A method for fabricating a photomask, comprising:
    setting a layout contour of a target pattern to be transferred onto a wafer;
    setting a small scale layout that is reduced a predetermined width inwardly from the layout contour of the target pattern;
    setting a peripheral pattern to have the layout contour of the target pattern and a contour of the small scale layout as a contour of the peripheral pattern;
    disposing a plurality of assist patterns inside the peripheral pattern, wherein the assist patterns are contained entirely inside the peripheral pattern and the plurality of assist patterns induce bridges between each of the assist patterns via optical interference that are formed when the peripheral pattern is transferred onto a wafer; and
    forming layouts of the peripheral pattern and the assist patterns on a mask substrate.

2. The method according to claim 1, wherein the assist patterns comprise a plurality of line patterns spaced from one another to induce a bridge between adjacent line patterns via optical interference when the assist pattern is transferred onto the wafer.

3. The method according to claim 1, wherein each of the line patterns comprises a light shielding region.

4. The method according to claim 1, wherein the assist patterns comprise a plurality of dot patterns spaced from one another to induce a bridge between adjacent dot patterns via optical interference when the assist pattern is transferred onto the wafer.

5. The method according to claim 1, wherein the assist patterns comprise a light transmitting region to induce a bridge between adjacent sections of the peripheral pattern via the optical interference when the assist pattern is transferred onto the wafer.

6. The method according to claim 1, wherein the peripheral pattern comprises dot patterns spaced from one another to induce a bridge between the dot patterns when the peripheral pattern is transferred onto the wafer.

7. The method according to claim 1, wherein the peripheral pattern comprises a light shielding region.

* * * * *